(12) United States Patent
Kadar et al.

(10) Patent No.: US 12,519,256 B2
(45) Date of Patent: Jan. 6, 2026

(54) ELECTRICAL CONNECTOR WITH MEANDER AND OPENING

(71) Applicant: Infineon Technologies AG, Neubiberg (DE)

(72) Inventors: Balazs Kadar, Warstein OT Allagen (DE); Bálint Palasik, Budapest (HU); Erwin Hymon, Möhnesee (DE); Tamás Gurnyik, Mogyoród (HU)

(73) Assignee: Infineon Technologies AG, Neubiberg (DE)

( * ) Notice: Subject to any disclaimer, the term of this patent is extended or adjusted under 35 U.S.C. 154(b) by 512 days.

(21) Appl. No.: 17/988,955

(22) Filed: Nov. 17, 2022

(65) Prior Publication Data

US 2024/0170868 A1 May 23, 2024

(51) Int. Cl.
*H01R 13/05* (2006.01)
*H01R 12/57* (2011.01)
*H01R 13/04* (2006.01)
*H01R 43/02* (2006.01)

(52) U.S. Cl.
CPC ............. *H01R 12/57* (2013.01); *H01R 13/04* (2013.01); *H01R 43/0221* (2013.01)

(58) Field of Classification Search
CPC .... H01R 12/57; H01R 13/04; H01R 43/0221; H01L 23/04; H01L 21/4853; H01L 23/3735; H01L 23/49811; H01L 23/4922; H01L 24/84; H01L 2224/84214
See application file for complete search history.

(56) References Cited

U.S. PATENT DOCUMENTS

| | | | | |
|---|---|---|---|---|
| 6,616,459 B2* | 9/2003 | Norris | .................. | H01R 12/585 439/943 |
| 8,708,757 B2* | 4/2014 | Trout | .................... | H01R 4/028 439/733.1 |
| 9,620,877 B2* | 4/2017 | Yao | ........................ | H01R 43/16 |
| 10,825,748 B2* | 11/2020 | Yao | ........................ | H01L 23/053 |
| 11,342,237 B2* | 5/2022 | Yao | ........................ | H01L 23/053 |

(Continued)

FOREIGN PATENT DOCUMENTS

| | | |
|---|---|---|
| DE | 102020215311 A1 | 6/2022 |
| EP | 2613352 A2 | 7/2013 |

(Continued)

*Primary Examiner* — Abdullah A Riyami
*Assistant Examiner* — Nelson R. Burgos-Guntin
(74) *Attorney, Agent, or Firm* — Murphy, Bilak & Homiller, PLLC

(57) ABSTRACT

An electrical connector includes an upper stanchion forming a first end of the electrical connector, a planar welding tab forming a second end of the electrical connector that is opposite the first end, a meander arranged between the planar welding tab and the upper stanchion, and an opening in the meander, wherein the first and second ends of the electrical connector are vertically spaced apart from one another in a vertical direction that is orthogonal to a plane of the planar welding tab, wherein the meander is meandered relative to the vertical direction, wherein the meander and the planar welding tab each extend laterally away from the upper stanchion in the same direction, and wherein an area of the welding tab that is within an outer lateral reach of the meander is exposed from above by the opening.

17 Claims, 4 Drawing Sheets

(56) References Cited

U.S. PATENT DOCUMENTS

| | | | | |
|---|---|---|---|---|
| 2006/0166479 A1* | 7/2006 | Seo | ............... | H01R 12/714 |
| | | | | 438/618 |
| 2008/0009195 A1* | 1/2008 | Ma | ............... | H01R 13/05 |
| | | | | 439/637 |
| 2009/0197439 A1* | 8/2009 | Nabilek | ............... | H01R 12/585 |
| | | | | 439/825 |
| 2012/0295490 A1* | 11/2012 | Schneider | ............... | H01R 12/91 |
| | | | | 29/423 |
| 2014/0199861 A1* | 7/2014 | Mattiuzzo | ............... | H01R 13/415 |
| | | | | 29/842 |
| 2015/0364847 A1* | 12/2015 | Yao | ............... | H01R 12/585 |
| | | | | 439/869 |
| 2017/0170083 A1* | 6/2017 | Yao | ............... | H01L 24/49 |
| 2017/0200704 A1* | 7/2017 | Kodaira | ............... | H01L 23/3735 |

FOREIGN PATENT DOCUMENTS

| | | |
|---|---|---|
| WO | 2020103406 A1 | 5/2020 |
| WO | 2020167603 A1 | 8/2020 |

\* cited by examiner

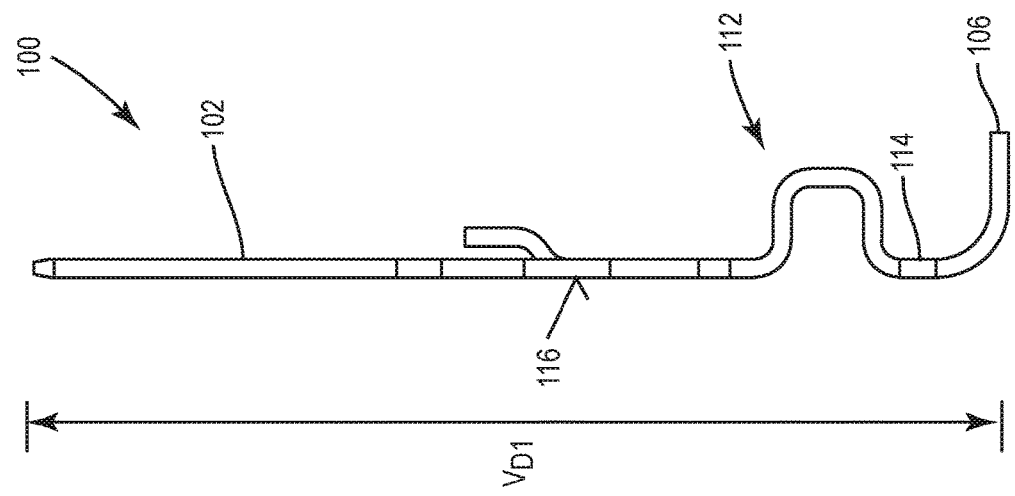
FIG. 1C
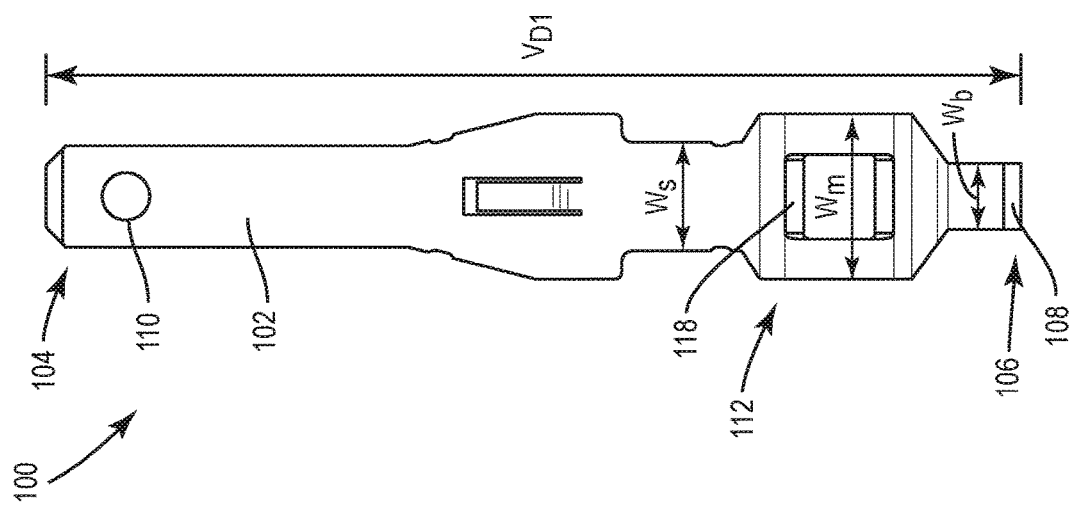
FIG. 1B
FIG. 1
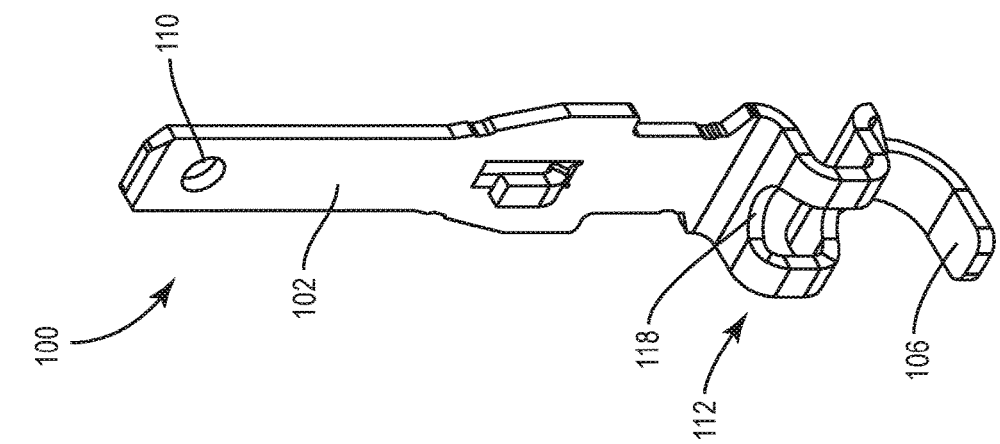
FIG. 1A

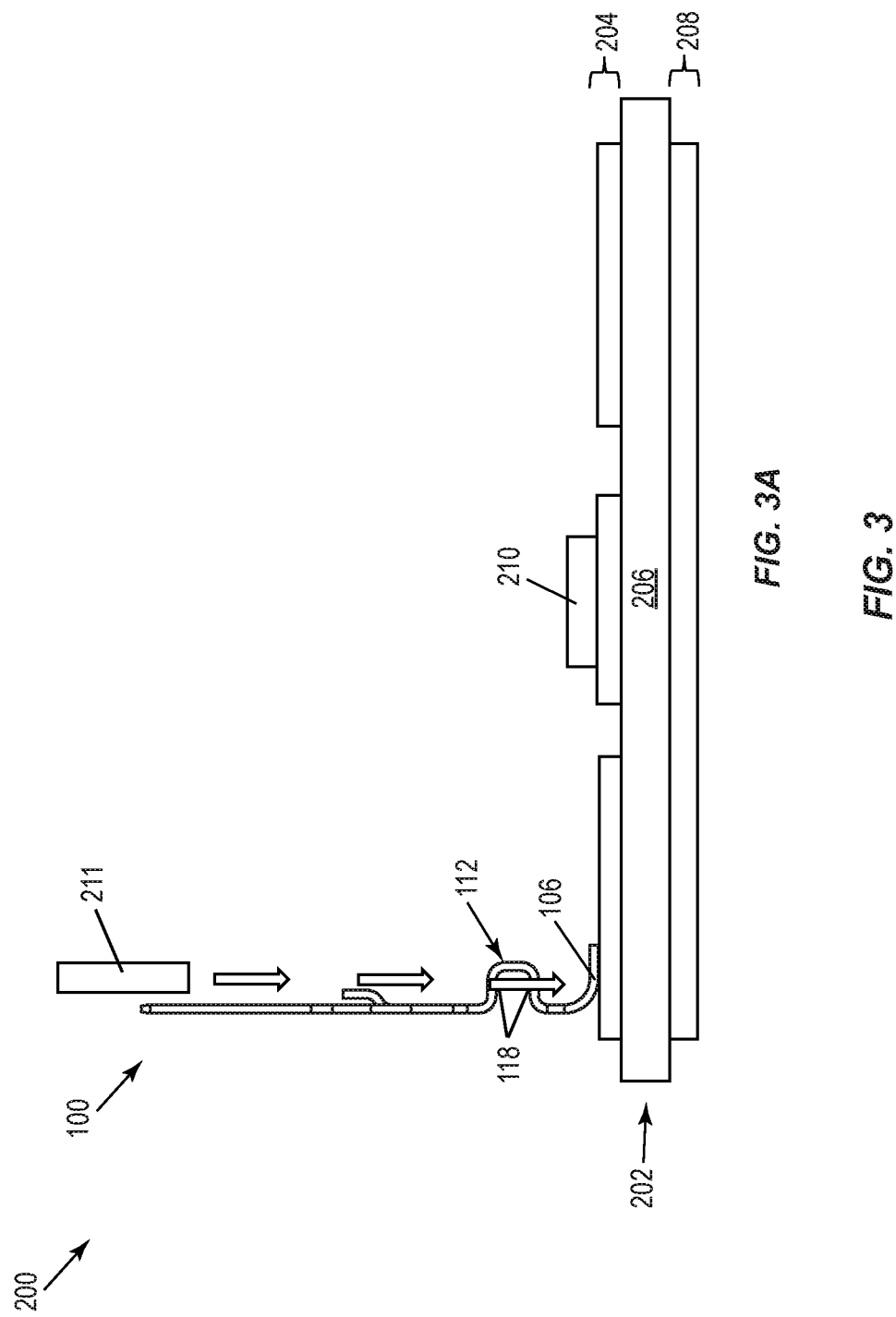

ELECTRICAL CONNECTOR WITH MEANDER AND OPENING

BACKGROUND

Semiconductor power modules are used in a wide variety of applications such as automotive, industrial motor drives, AC-DC power supplies, etc. Semiconductor power modules include multiple power semiconductor devices, e.g., power MOSFETs (metal-oxide semiconductor field-effect transistor), IGBTs (insulated gate bipolar transistors), HEMT (high electron mobility transistors), etc., along with other elements such as passive components, bond wires, etc., mounted on a common substrate. The electrical interconnections of semiconductor power modules must withstand large amounts of current, voltage and heat. It would be desirable to produce a produce a semiconductor power module at lower cost with similar or better performance characteristics than conventional solutions.

SUMMARY

An electrical connector is disclosed. According to an embodiment, the electrical connector comprises an upper stanchion forming a first end of the electrical connector, a planar welding tab forming a second end of the electrical connector that is opposite the first end, a meander arranged between the planar welding tab and the upper stanchion; an opening in the meander, wherein the first and second ends of the electrical connector are vertically spaced apart from one another in a vertical direction that is orthogonal to a plane of the planar welding tab, wherein the meander is meandered relative to the vertical direction, wherein the meander and the planar welding tab each extend laterally away from the upper stanchion in the same direction, and wherein an area of the welding tab that is within an outer lateral reach of the meander is exposed from above by the opening.

A method of forming a power semiconductor module is disclosed. According to an embodiment, the method comprises providing a power electronics carrier that comprises a structured metallization layer disposed an upper side of an electrically insulating substrate, mounting a power semiconductor die on the structured metallization layer, providing an electrical connector that comprises an upper stanchion, a planar welding tab, a meander arranged between the planar welding tab and the upper stanchion, and an opening in the meander, and welding the electrical connector to the structured metallization layer by a laser welding process whereby laser energy is directed at the welding tab from above, wherein at least some of the laser energy passes through the opening.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A, 1B, and 1C, illustrates an electrical connector, according to an embodiment. FIG. 1A illustrates the electrical connector from an isometric perspective; FIG. 1B illustrates the electrical connector from a front-view perspective; and FIG. 1C illustrates the electrical connector from a side-view perspective.

FIGS. 2A and 2B, illustrates close-up views of a base region of the electrical connector, according to an embodiment. FIG. 2A illustrates the base region of the electrical connector from a side-view perspective; and FIG. 2B illustrates the base region of the electrical connector from a plan-view perspective.

FIG. 3, which includes FIGS. 3A and 3B, illustrates selected method steps in a method of forming a power semiconductor module, according to an embodiment. FIG. 3A illustrates a step of laser welding the electrical connector to a carrier; and FIG. 3B illustrates a step of attaching a housing to the power semiconductor module.

DETAILED DESCRIPTION

Figure 2:
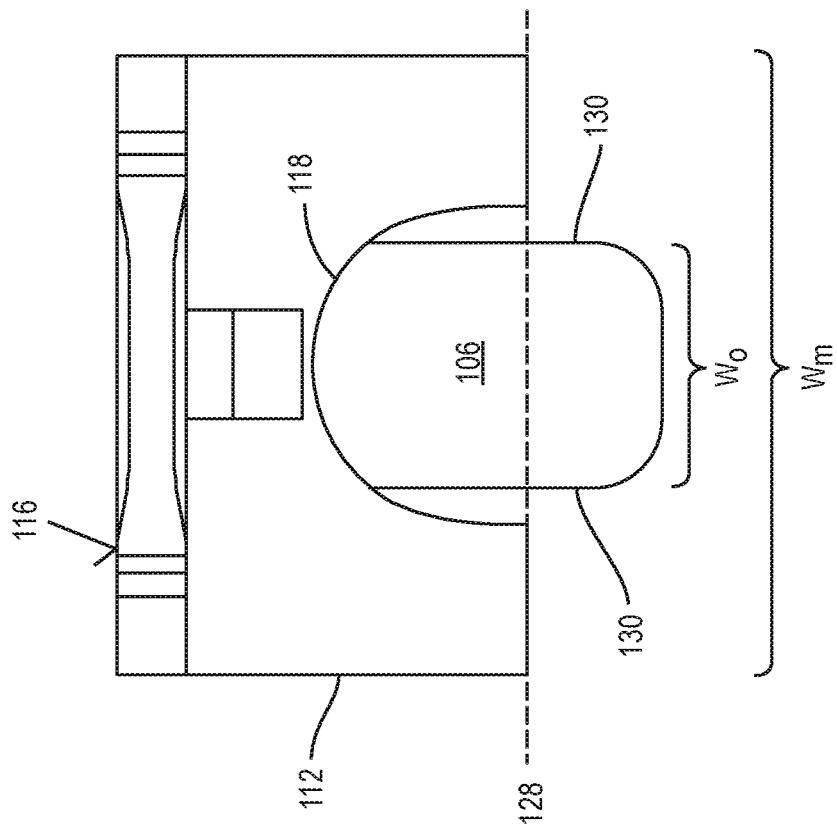
FIG. 2, which includes
Figure 2:
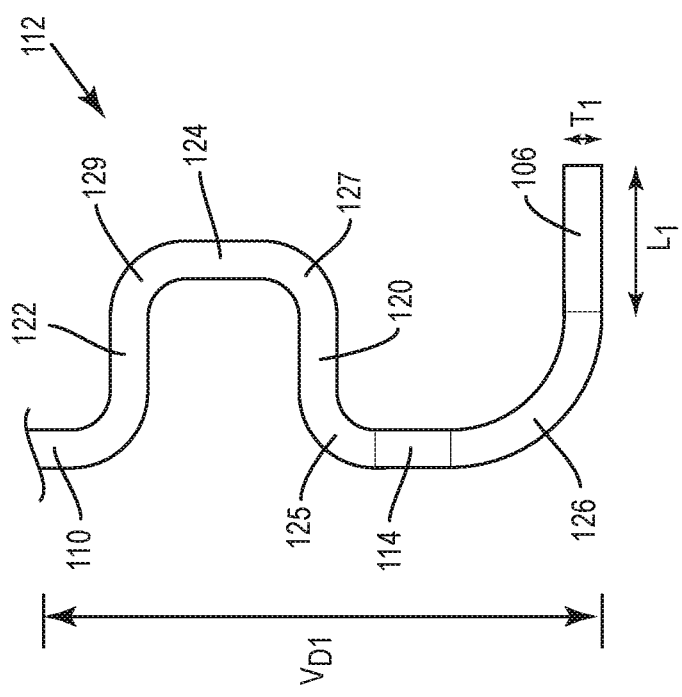

Embodiments of an electrical connector and a corresponding method of forming a power semiconductor module that comprises the electrical connector are disclosed herein. The electrical connector is an electrically conductive element that is used to provide an external terminal connection of the power semiconductor module. The electrical connector comprises a meander in a base region that is configured as a spring mechanism. This allows the electrical connector to better withstand mechanical stress and strain that may be applied during various events, such as assembly of the power semiconductor module, insertion and/or removal the electrically conductive element within a receptacle, and cyclic loading during operation. The electrical connector is advantageously configured to be attached by a laser welding process. This is preferable due to the precision and automation of this technique. The electrical connector is also advantageously configured to have a minimal lateral footprint. This is preferable to maintain a space efficient design of the power semiconductor module. The minimal lateral footprint is realized by a configuration whereby the meander extends to the same side of the electrical connector as the welding tab. The electrical connector includes an opening in the meander that permits laser energy to pass through it and reach the welding tab.

Referring to FIG. 1, an electrical connector 100 is depicted, according to an embodiment. The electrical connector 100 is formed from an electrically conductive metal. For example, the electrical connector 100 can be formed copper, aluminium and alloys thereof. The electrical connector 100 can comprise additional coating layers, e.g., anti-corrosion layers, adhesion layers, which may comprise a different type of metal, e.g., nickel, silver, palladium, gold, tin, etc., and alloys thereof. The electrical connector 100 can be a substantially uniform thickness structure. For example, the electrical connector 100 can be formed from a planar sheet metal and the features depicted herein can be formed by metal processing techniques, e.g., punching, bending, stamping, etc. The thickness $T_1$ of the electrical connector 100 (shown in FIG. 2A) can be in the range of 0.25 mm (millimeters)-1.0 mm. In a specific embodiment, the thickness of the electrical connector 100 is approximately 0.5 mm.

The electrical connector 100 comprises upper stanchion 102 forming a first end 104 of the electrical connector 100 and a planar welding tab 106 forming a second end 108 of the electrical connector 100 that is opposite the first end 104. In this context, the first and second ends 102, 108 refer to the outermost points or surfaces of the electrical connector 100. In the depicted embodiment, the first end 104 of the electrical connector 100 corresponds to a planar edge surface of the upper stanchion 102 and the second end 108 of the electrical connector 100 corresponds to a lower surface of the planar welding tab 106. The first and second ends 102, 108 of the electrical connector 100 are vertically spaced apart from one another in a vertical direction $V_{D1}$ that is orthogonal to a plane of the planar welding tab 106. The plane of the planar welding tab 106 refers to the plane that the lower surface of the planar welding tab 106 extends along.

The upper stanchion 102 is a portion of the electrical connector 100 that protrudes out of a housing and mates with a correspondingly shaped receptacle to form a contact electrical connection. According to an embodiment, the electrical connector 100 comprises a mating interface 110 in the upper stanchion 102. As shown, the mating interface 110 is configured as a centrally located perforation in the upper stanchion 102 near the first end 104. This perforation can engage with a receiving structure to form a mechanically secure connection. Alternatively, the mating interface 110 can include features that are designed to plastically deform and/or may include a spring-loaded contact mechanism so as to provide a force-fitting connection. In the depicted embodiment, the upper stanchion 102 has a generally planar geometry. In other embodiments, the upper stanchion 102 section may have a cylindrical geometry.

The planar welding tab 106 is a mounting feature of the electrical connector 100 that is used to securely affix the electrical connector 100 to a metal surface, such as a structured metallization layer from a circuit carrier. The lower surface of the planar welding tab 106 forms a mating surface of the electrical connector 100 that is flush against and welded to a metal surface.

The electrical connector 100 comprises a meander 112 that is arranged between the planar welding tab 106 and the upper stanchion 102. The term "meander" refers to a continuous geometry that deviates away from a fixed plane and then reverses its direction to return to the fixed plane. The meander 112 of the electrical connector 100 is meandered relative to the vertical direction $V_{D1}$. In the depicted embodiment, the electrical connector 100 the upper stanchion 102 and a base span 114 of the electrical connector 100 extend along the same plane in the vertical direction $V_{D1}$. The meander 112 deviates away from this plane and then reverses its direction to return to this plane.

The meander 112 and the planar welding tab 106 each extend laterally away from the upper stanchion 102 in the same direction. That is, the electrical connector 100 is configured such that the meander 112 and the planar welding tab 106 to one side of an outer face 116 of the electrical connector 100 formed by the upper stanchion 102.

The electrical connector 100 comprises opening 118 in the meander 112. The opening 118 is a complete perforation in the structure of the electrical connector 100 that creates a window for laser energy to pass through from above the electrical connector 100, e.g., according to the laser welding process that will be described in further detail below. Stated another way, the opening 118 eliminates a portion of the meander 112 that would otherwise overlap with the planar welding tab 106, thus exposing at least a partial area of the planar welding tab 106. In the depicted embodiment, the opening 118 has a stadium geometry. Other geometries for the opening 118 are possible, such as rectangular geometries, circular geometries, and other types of oval geometries.

Referring to FIG. 2, the base region of the electrical connector 100 comprising the planar welding tab 106, the meander 112 and the opening 118 is shown in closer detail.

As shown in FIG. 2A, the meander 112 may comprise first and second planar spans 120, 122 that are vertically spaced apart from one another and a third planar span 124 extending vertically between the first and second spans. The first and second planar spans 120, 122 each extend in a lateral direction that is perpendicular to the vertical direction $V_{D1}$ and the third planar span 124 extends in the vertical direction $V_{D1}$. The meander 112 further comprises second, third and fourth curved bends 125, 127 and 129 that adjoin at least one of the of the first, second, and third planar spans 120, 122, 124.

In addition to the depicted embodiment, the meander 112 may have the following different configurations. The meander 112 may comprise planar spans that are oriented at an oblique angle relative to the vertical direction $V_{D1}$. For example, the meander 112 may consist of two planar spans that are tilted towards one another along intersecting planes, and a curved bend may form a transition between these planar spans. In another example, the meander 112 may have four or more planar spans. In that case, the meander 112 may reverse its direction multiple times. This includes geometries with replicated pairs of spans that are tilted towards one another along intersecting planes, e.g., as described above. This also includes geometries that replicate the arrangement of the first, second, and third planar spans 120, 122, 124 shown in FIG. 2A two or more times.

As shown in FIG. 2B, an area of the planar welding tab 106 that is within an outer lateral reach 128 of the meander 112 is exposed from above by the opening 118. The outer lateral reach 128 of the meander 112 is defined by the point or surface on the meander 112 that is furthest away from the outer face 116 of the electrical connector 100. In the depicted embodiment, the third planar span 124 defines the outer lateral reach 128 of the meander 112. The opening 118 creates a window through the meander 112 to reach the region of the planar welding tab 106 would otherwise be directly overlapping with the meander 112.

According to an embodiment, the width $W_O$ of the opening 118 is equal to or greater than the width of the planar welding tab 106. In this context, the width of the opening 118 refers to a widest distance between two opposing outer edge sides of the opening 118. Likewise, the width of the planar welding tab 106 refers to a widest distance between two opposing outer edge sides 130 in the same measurement direction as the width of the opening 118. By making the opening 118 at least as wide as the planar welding tab 106, complete or near complete exposure of the planar welding tab 106 from above is possible. The embodiment of FIG. 2 illustrates one example of this. In the depicted embodiment, the width $W_O$ of the opening 118 is slightly greater than width of the planar welding tab 106, and the opening 118 is aligned with the planar welding tab 106 such that the opposite facing outer edge sides 130 of the planar welding tab 106 that are within the outer lateral reach 128 of the meander 112 are exposed from above by the opening 118. Thus, the complete area of the planar welding tab 106 is exposed from above by the opening 118. In other embodiments, the opening 118 may be dimensioned and/or aligned in such a way that a partial area of the planar welding tab 106 is not exposed from above by the opening 118, i.e., overlaps with the meander 112 portion of the electrical connector 100.

Referring to FIG. 3A, a method of forming a power semiconductor module 200 comprises providing a power electronics carrier 202. The power electronics carrier 202 102 is an electronics carrier that is configured to accommodate the mounting of power devices thereon and to efficiently extract heat away from these devices. According to an embodiment, the power electronics carrier 202 is any one of: a DCB (direct copper bonded) substrate, an AMS substrate (anodized metal substrate), an AMB substrate (active metal brazed), or an IMS (insulated metal substrate) substrate. The power electronics carrier 202 comprises a structured metallization layer 204 disposed on an upper side of an electrically insulating substrate 206 and a second metallization layer 208 disposed on a rear side of the electrically insulating substrate 206. The structured metallization layer 204 comprises a plurality of pads that are electrically isolated from one another and configured to accommodate the mounting of semiconductor dies and/or provide electrical interconnect. The structured metallization layer 204 and the second metallization layer 208 may comprise or be plated with any one or more of the following: copper, nickel, silver, gold, palladium and platinum. The electrically insulating substrate 206 may comprise a ceramic material. For example, the electrically insulating substrate 206 can be a thin ceramic layer that is formed from or comprises any one or more of the following: aluminum oxide, aluminum nitride, zirconium oxide, silicon nitride, boron nitride, silicon carbide, beryllium oxide.

Forming the power semiconductor module 200 comprises mounting a semiconductor die 210 on the structured metallization layer 204. The semiconductor die 210 may be physically attached and optionally electrically connected to a structured pad from the structured metallization layer 204 by a conductive adhesive, e.g., solder, sinter, conductive glue, etc. According to an embodiment, the semiconductor die 210 is configured as a power semiconductor die. A power semiconductor die refers to a single device that is rated to accommodate voltages of at least 100V (volts), and more typically voltages of 600V, 1200V or more and/or is rated to accommodate currents of at least 1 A (amperes), and more typically currents of 10 A, 50 A, 100 A or more. Examples of power semiconductor dies include discrete power diodes and discrete power transistor dies, e.g., MOSFETs (Metal Oxide Semiconductor Field Effect Transistors), IGBTs (Insulated Gate Bipolar Transistors), and HEMTs (High Electron Mobility Transistors), etc. Separately or in combination, the power semiconductor module 200 may comprise other types of devices, e.g., logic devices, custom circuits, controllers, sensing devices, passive elements, etc.

Forming the power semiconductor module 200 comprises welding the electrical connector 100 to the structured metallization layer by a laser welding process. According to this technique, the electrical connector 100 is arranged on the power electronics carrier 202 with the lower surface of the planar welding tab 106 being flush against a structured pad from the structured metallization layer 204. Subsequently, the laser welding process comprises providing a laser welding apparatus 211 directly over the planar welding tab 106. The laser welding apparatus 211 applies concentrated radiation from a continuous or pulsed laser beam to fuse the material of the planar welding tab 106 and the structured metallization layer 204 together. According to an embodiment, the laser energy is applied in a direction that is orthogonal to a plane of the planar welding tab 106. During the laser welding process at least some of the laser energy passes through the opening 118. Thus, the opening 118 allows for the area of the planar welding tab 106 that is within an outer lateral reach 128 (e.g., as described with reference to FIG. 2) to be laser welded from directly above.

Figures 3, 3B:
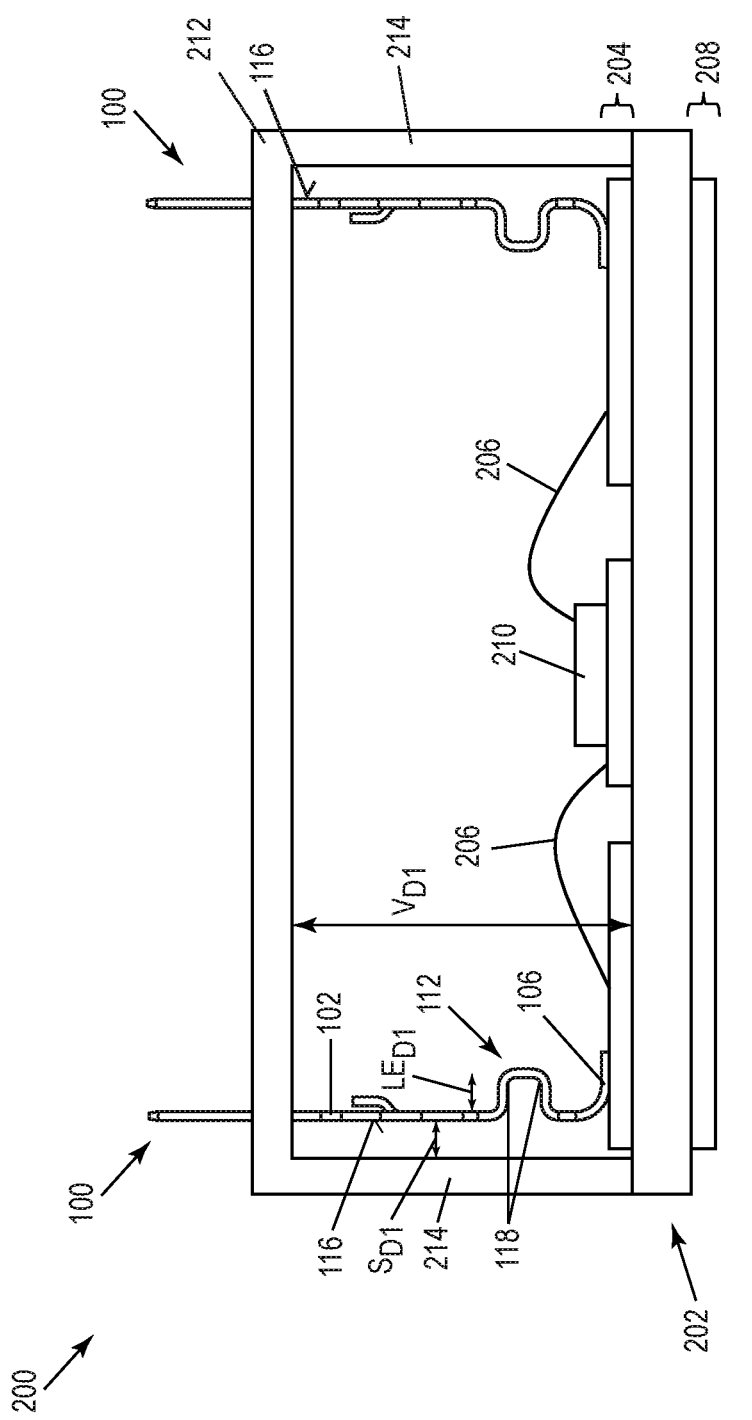

Referring to FIG. 3B, forming the power semiconductor module 200 comprises arranging a housing 212 over the power electronics carrier 202 such that the housing 212 encloses an interior volume of the power semiconductor module 200. In this context, the interior volume refers to a three-dimensional space that is disposed over and around the power electronics carrier 202. In certain configurations, the housing 212 may also surround a volume that is below portions of the power electronics carrier 202. Thus, the housing 212 in combination with the power electronics carrier 202 define a three-dimensional space. The housing 212 comprises outer sidewalls 214 and may comprise a roof section that partially or completely encloses the interior volume. In other embodiments, the housing 212 may work in combination with a lid structure that is placed on the housing 212 to enclose the interior volume. In the depicted embodiment, the housing 212 is affixed directly to the power electronics carrier 202. Thus, the power electronics carrier 202 provides a floor section of the power semiconductor module 200. In other embodiments, the housing 212 can be affixed to a separate metal baseplate, e.g., a planar baseplate comprising copper, aluminum, alloys thereof, etc. In that case, the power electronics carrier 202 can also be mounted on the metal baseplate and thermally coupled to the metal baseplate via the second metallization layer. In either case, housing 212 can be affixed to the subjacent structure using an adhesive, such as an electronics glue.

In the depicted embodiment, for each of the electrical connectors 100, the outer face 116 of the electrical connector 100 is immediately opposite from one of the outer sidewalls 214. As a result, the meander 112 and the planar welding tab 106 each extend laterally in the same direction away from the sidewall 214 that the electrical connector 100 is immediately opposite from. According to an embodiment, a separation distance $S_{D1}$ between the upper stanchion 102 and the sidewall 214 of the housing 212 is less than or equal to a lateral extension distance LEDs of the meander 112. The lateral extension distance LEDs of the meander 112 refers to a distance between the upper stanchion 102 and the outer lateral reach 128 of the meander 112 (shown in FIG. 2B).

Forming the power semiconductor module 200 comprises electrically connecting the electrical connectors 100 to the devices contained within the housing 212. For example, the electrical connectors 100 can be configured as power terminals that are connected to the load terminals of the semiconductor die 210, e.g., source, drain, collector, emitter, etc. In the depicted embodiment, the power semiconductor module 200 comprises bond wires 216 that complete an electrical connection between the pad to which an electrical connector 100 is welded to and the terminals of the semiconductor die 202. Other types of electrical interconnect elements such as metal clips or ribbons may be used instead. Further, the electrical connectors 100 may be welded to the same structured pad that also is electrically connected to a lower surface terminal of a device, thus eliminating the need for an electrical interconnect element.

Forming the power semiconductor module 200 may additionally comprise filling the interior volume enclosed by the housing within the housing 212 with an encapsulant material. The encapsulant material may be a curable potting compound, such as a silicone based dielectric gel, for example. According to this process, the potting compound is filled into the housing at high temperatures and subsequently cooled and hardened.

In the completed power semiconductor module 200, the electrical connector 100 protrudes out from the housing 212 and form externally accessible terminals. These terminals can be inserted into correspondingly shaped receptacles, e.g., from a PCB or other type of electrical redistribution structure, thus forming a quick and reliable electrical connection.

According to an embodiment, the completed power semiconductor module 200 is configured as a half-bridge. In that case, the power semiconductor module 200 comprises one or more half-bridge circuits, each of which comprise a high-side and low-side switch, which may be provided by one or more semiconductor dies 210 that are configured as power semiconductor dies. The power semiconductor module 200 configured as a half-bridge may include additional devices, such as driver devices to control the switching operation of the half-bridge, and passive elements. In that case, the electrical connector 100 may be configured as a power terminal that provides a fixed voltage, e.g., VDD, VSS, GND, to the one of the high-side and low-side switches.

The electrical connectors 100 may experience significant forces applied to them during the assembly of the power semiconductor module 200, during insertion or of the electrical connector 100 into a receptacle or removal therefrom, or during operation. These forces may be static loads or oscillating loads, e.g., from vibration. It is therefore desirable to configure the power semiconductor module 200 such that the electrical connectors 100 can accommodate substantial forces, particularly stress or strain forces that are applied in the vertical direction $V_{D1}$ of the electrical connectors 100 and remain intact with minimal plastic deformation.

The meander 112 advantageously forms a spring mechanism in a base region of the electrical connector 100 that is designed to elastically deform in response stress or strain forces applied in the vertical direction $V_{D1}$ of the electrical connector 100. The meander 112 of the electrical connector 100 creates a compression spring mechanism that compresses about the transitional bends in the electrical connector 100. As a result, the electrical connector 100 is able to withstand the above-descried forces with minimal plastic deformation.

The presence of the opening 118 within the meander 112 advantageously allows for the electrical connector 100 to be mechanically and electrically connected via the above-described welding process and have the meander 112 with advantageous elastic properties and with advantageous space-efficiency within the power semiconductor module 200. Laser welding is preferable because it may be performed by an automated process whereby the laser welding apparatus 211 is remotely controlled by a multi-axis robotic delivery system. Moreover, the laser welding performs precise heating in a desired location, resulting in high-quality welds in small areas with minimal impact outside of the weld zone. However, laser welding requires clearance from above the workpiece to apply the laser energy. Thus, in electrical connectors with a meander, the design must not block the laser energy. One possible approach is to configure an electrical connector such that the meander and the welding tab each extend laterally away from the upper stanchion in opposite directions. However, the drawback of this approach is that it requires more clearance around the electrical connector. For example, with this design, the above-described embodiment wherein separation distance $S_{D1}$ between the upper stanchion 102 and the sidewall 214 of the housing 212 is less than or equal to a lateral extension distance LEDs of the meander 112 would not be possible. The disclosed design advantageously avoids this issue by providing the meander 112 and the planar welding tab 106 each extending laterally away from the upper stanchion 102 in the same direction and providing the opening 118 in the meander 112 so that laser energy applied from above can pass through the meander 112 and reach the planar welding tab 106.

Referring again to FIG. 2, the inventors have extensively studied various designs of an electrical connector 100 with a meander 112 that is configured as a spring mechanism, extends away from the upper stanchion 102 in the same direction as the welding tab 106, and is designed to permit laser energy applied from above to reach the planar welding tab 106 and concluded that the disclosed design exhibits many preferable characteristics. These preferable characteristics include advantageously high elastic behavior and hence advantageously low plastic strain, the ability to withstand large forces without mechanical point failures, and a large exposed area of the planar welding tab 106 that is accessible for laser welding. Aspects of the design that were found obtain these preferable characteristics include the following.

The electrical connector 100 comprises a first curved bend 126 that adjoins the planar welding tab 126 and curves towards the meander 112. The first curved bend 126 combined with the meander 112 to form the spring mechanism that is designed to elastically deform in response stress or strain forces applied in the vertical direction $V_{D1}$ of the electrical connector 100. Additionally, the first curved bend 126 allows for the planar welding tab 106 to be partially laterally offset from the meander 112, making it possible to completely expose the planar welding tab 126 via the opening. In the depicted embodiment, the electrical connector 100 comprises a planar base span 114 first curved bend 126 between the first curved bend 126 and the meander 112. In other embodiments, the planar base span 114 may be omitted such that the electrical connector 100 smoothly transitions between the first curved bend 126 and the meander 112.

According to an embodiment, a radius of the first curved bend 126 is between 2 and 4 times the thickness $T_1$ of the electrical connector 100. Separately or in combination, the radius of the first curved bend 126 may be between 0.5 times and 1.0 times the length $L_1$ of the planar welding tab 106. In a specific embodiment, the radius of the first curved bend 126 is 3.0 times the thickness $T_1$ of the electrical connector 100 and/or is 0.75 times the length $L_1$ of the planar welding tab 106. Stated in numerical terms, the radius of the first curved bend 126 may be between 1.0 mm and 2.0 mm, with the thickness $T_1$ of the electrical connector 100 being between 0.25 mm and 0.75 mm and/or the length $L_1$ of the planar welding tab 106 being between 1.5 mm and 2.5 mm. In a specific embodiment, the radius of the first curved bend 126 is 1.5 mm, with the thickness $T_1$ of the electrical connector 100 being 0.5 mm and/or the length $L_1$ of the planar welding tab 106 being 2.0 mm.

The electrical connector 100 comprises curved bends between each transition of the meander 112. As shown, the electrical connector 100 comprises a second curved bend 125 that transitions between the base span 114 and the first planar span 120, a third curved bend 127 that transitions between the first planar span 120 and the third planar span 124, and a fourth curved bend 129 that transitions between the third planar span 124 and the second planar span 122. By providing these curved bends at each transition, the spring behavior of the meander 112 is increased and the susceptibility of the meander 112 to singularities and hence mechanical failure is decreased.

According to an embodiment, the radius of each of the second, third and fourth curved bends 125, 127, 129 is between 0.5 times and 1.5 the thickness $T_1$ of the electrical connector 100. Separately or in combination, the radius of each of the second, third and fourth curved bends 125, 127, 129 is between 0.05 and 0.25 times the lateral extension distance $LE_{D1}$ of the meander 112 (identified in FIG. 3B). In a specific embodiment, the radius of each of the second, third and fourth curved bends 125, 127, 129 is 1.0 times the thickness $T_1$ of the electrical connector 100 and/or 0.16 times the lateral extension distance $LE_{D1}$ of the meander 112. Stated in numerical terms, the radius of each of the second, third and fourth curved bends 125, 127, 129 may be between 0.25 mm and 0.75 mm, with the thickness $T_1$ of the electrical connector 100 being between 0.25 mm and 0.75 mm and/or the lateral extension distance $LE_{D1}$ of the meander 112 being between 2.0 mm and 4.0 mm. In a specific embodiment, the radius of each of the second, third and fourth curved bends 125, 127, 129 is 0.5 mm, with the thickness $T_1$ of the electrical connector 100 being 0.5 mm and/or the lateral extension distance $LE_{D1}$ of the meander 112 being between 3.0 mm.

The meander 112 forms a locally wider section of the electrical connector 100. That is, the width $W_m$ of the electrical connector 100 in the meander 112 is greater than the width $W_s$ of the electrical connector 100 in the upper stanchion (identified in FIG. 1B) that adjoins the meander 112, which may correspond to a minimum width of the upper stanchion 102. Further, the width $W_m$ of the electrical connector 100 in the meander 112 is greater than the width $W_b$ of the electrical connector 100 in the base region (identified in FIG. 1B) that adjoins the meander 112. As mentioned above, the electrical connector 100 is preferably configured such that the width $W_O$ opening 118 equal to or greater than the width of the planar welding tab 106. The width $W_m$ of the electrical connector 100 in the meander 112 must therefore accommodate on opening 118 of this size and accommodate sections of the electrical connector 100 on either side of the opening 118 that are sufficiently wide to withstand the stress and strain forces applied to the electrical connector 100.

According to an embodiment, the width $W_m$ of the electrical connector 100 in the meander 112 is between 1.25 times and 2.0 times the width $W_s$ of the electrical connector 100 in the upper stanchion and/or between 2.0 times and 3.0 times the width $W_b$ of the electrical connector 100 in the base region. In a specific embodiment, the width $W_m$ of the electrical connector 100 in the meander 112 is 1.625 times the width $W_s$ of the electrical connector 100 in the upper stanchion and/or is 2.52 times the width $W_b$ of the electrical connector 100 in the base region. Stated in numerical terms, the width $W_m$ of the electrical connector 100 in the meander 112 may be between 4.0 and 5.0 mm, the width $W_s$ of the electrical connector 100 in the upper stanchion may be between 2.2 mm and 3.2 mm, and/or the width $W_b$ of the electrical connector 100 in the base region may be between 1.6 mm and 2.0 mm. In a specific embodiment, the width $W_m$ of the electrical connector 100 in the meander 112 is 4.55 mm, the width $W_s$ of the electrical connector 100 in the upper stanchion is 2.8 mm, and the width $W_s$ of the electrical connector 100 in the base region is 1.8 mm.

According to an embodiment, the width $W_m$ of the electrical connector 100 in the meander 112 is approximately 1.75 to 2.5 times the width $W_O$ of the opening 118. Further, the opening 118 may be centrally located within the meander 112 such that two approximately equal width sections of the electrical connector 100 are disposed on either side of the opening 118, thus making these equal width sections each be between 0.375 and 0.75 times the width $W_O$ of the opening 118. In a specific embodiment, the width $W_m$ of the electrical connector 100 in the meander 112 is approximately 2.05 times the width $W_O$ of the opening 118, and the sections of the electrical connector 100 disposed on either side of the opening 118 are each approximately 0.53 times the width $W_O$ of the opening 118. Stated in numerical terms, the width $W_m$ of the electrical connector 100 in the meander 112 may be between 4.0 mm and 5.0 mm, with the width $W_O$ of the opening 118 may be between 2.0 mm and 3.0 mm, and the sections of the electrical connector 100 are disposed on either side of the opening 118 may be between 0.75 mm and 1.25 mm. In a specific embodiment, the width $W_m$ of the electrical connector 100 in the meander 112 may be 4.55 mm, the width $W_O$ of the opening 118 may be 2.35 mm, and the sections of the electrical connector 100 that are disposed on either side of the opening 118 may each be 1.1 mm.

Although the present disclosure is not so limited, the following numbered examples demonstrate one or more aspects of the disclosure.

Example 1. An electrical connector, comprising an upper stanchion forming a first end of the electrical connector; a planar welding tab forming a second end of the electrical connector that is opposite the first end, a meander arranged between the planar welding tab and the upper stanchion, and an opening in the meander, wherein the first and second ends of the electrical connector are vertically spaced apart from one another in a vertical direction that is orthogonal to a plane of the planar welding tab, wherein the meander is meandered relative to the vertical direction, wherein the meander and the planar welding tab each extend laterally away from the upper stanchion in the same direction, and wherein an area of the welding tab that is within an outer lateral reach of the meander is exposed from above by the opening.

Example 2. The electrical connector of claim 1, wherein a width of the opening is equal to or greater than a width of the planar welding tab.

Example 3. The electrical connector of example 2, wherein the width of the opening is greater than the width of the planar welding tab, and wherein the opening is aligned with the planar welding tab such that opposite facing outer edge sides of the planar welding tab that are within the outer lateral reach of the meander are exposed from above by the opening.

Example 4. The electrical connector of example 1, wherein the meander forms a locally widened part of the electrical connector.

Example 5. The electrical connector of example 4, wherein a width of the mender is at least 1.5 times a width of the opening.

Example 6. The electrical connector of example 4, wherein the opening is approximately centrally located in the meander between two approximately equal width sections of the electrical connector that are disposed on either side of the opening.

Example 7. The electrical connector of example 1, wherein the meander comprises first and second planar spans that are vertically spaced apart from one another, and wherein the opening extends continuously through the first and second spans.

Example 8. The electrical connector of example 1, wherein the electrical connector comprises a first curved bend that adjoins the welding tab and curves towards the meander, and wherein the first curved bend and the meander collectively form a spring that elastically deforms in the vertical direction.

Example 9. The electrical connector of example 8, wherein a radius of the first curved bend is between two and four times a thickness of the electrical connector.

Example 10. The electrical connector of example 1, wherein the upper stanchion comprises a mating interface.

Example 11. A method of forming a power semiconductor module, the method comprising providing a power electronics carrier that comprises a structured metallization layer disposed an upper side of an electrically insulating substrate, mounting a power semiconductor die on the structured metallization layer, providing an electrical connector that comprises an upper stanchion, a planar welding tab, a meander arranged between the planar welding tab and the upper stanchion, and an opening in the meander, and welding the electrical connector to the structured metallization layer by a laser welding process whereby laser energy is directed at the welding tab from above, wherein at least some of the laser energy passes through the opening.

Example 12. The method of example 11, wherein the laser welding process directs the laser energy in a direction that is orthogonal to a plane of the planar welding tab.

Example 13. The method of example 11, further comprising arranging a housing over the power electronics carrier such that the housing encloses an interior volume of the power semiconductor module, wherein the electrical connector is immediately opposite from a sidewall of the housing, and wherein the meander and the planar welding tab each extend laterally away from the sidewall of the housing in the same direction.

Example 14. The method of example 13, wherein a separation distance between the upper stanchion and the sidewall of the housing is less than or equal to a lateral extension distance of the meander.

Example 15. The method of example 11, wherein the power semiconductor module is configured as a half-bridge, and wherein the electrical connector is configured as a power terminal to the half-bridge.

Example 16. The method of example 11, wherein the width of the opening is at is greater than the width of the planar welding tab, and wherein the opening is aligned with the planar welding tab such that opposite facing outer edge sides of the planar welding tab that are within the outer lateral reach of the meander are exposed from above by the opening.

Example 17. The method of example 11, wherein the electrical connector comprises a first curved bend that adjoins the welding tab and curves towards the meander, and wherein the first curved bend and the meander collectively form a spring that elastically deforms in a vertical direction that is orthogonal to a plane of the welding tab.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrical connector, comprising:
    an upper stanchion forming a first end of the electrical connector;
    a planar welding tab forming a second end of the electrical connector that is opposite the first end;
    a meander arranged between the planar welding tab and the upper stanchion; and
    an opening in the meander,
    wherein the first and second ends of the electrical connector are vertically spaced apart from one another in a vertical direction that is orthogonal to a plane of the planar welding tab,
    wherein the meander is meandered relative to the vertical direction,
    wherein the meander and the planar welding tab each extend laterally away from the upper stanchion in the same direction, and
    wherein an area of the welding tab that is within an outer lateral reach of the meander is exposed from above by the opening.

2. The electrical connector of claim 1, wherein a width of the opening is equal to or greater than a width of the planar welding tab.

3. The electrical connector of claim 2, wherein the width of the opening is greater than the width of the planar welding tab, and wherein the opening is aligned with the planar welding tab such that opposite facing outer edge sides of the planar welding tab that are within the outer lateral reach of the meander are exposed from above by the opening.

4. The electrical connector of claim 1, wherein the meander forms a locally widened part of the electrical connector.

5. The electrical connector of claim 4, wherein a width of the meander is at least 1.5 times a width of the opening.

6. The electrical connector of claim 4, wherein the opening is approximately centrally located in the meander between two approximately equal width sections of the electrical connector that are disposed on either side of the opening.

7. The electrical connector of claim 1, wherein the meander comprises first and second planar spans that are vertically spaced apart from one another, and wherein the opening extends continuously through the first and second spans.

8. The electrical connector of claim 1, wherein the electrical connector comprises a first curved bend that adjoins the welding tab and curves towards the meander, and wherein the first curved bend and the meander collectively form a spring that elastically deforms in the vertical direction.

9. The electrical connector of claim 8, wherein a radius of the first curved bend is between two and four times a thickness of the electrical connector.

10. The electrical connector of claim 1, wherein the upper stanchion comprises a mating interface.

11. A method of forming a power semiconductor module, the method comprising:
providing a power electronics carrier that comprises a structured metallization layer disposed an upper side of an electrically insulating substrate;
mounting a power semiconductor die on the structured metallization layer;
providing an electrical connector that comprises an upper stanchion, a planar welding tab, a meander arranged between the planar welding tab and the upper stanchion, and an opening in the meander; and
welding the electrical connector to the structured metallization layer by a laser welding process whereby laser energy is directed at the welding tab from above,
wherein at least some of the laser energy passes through the opening.

12. The method of claim 11, wherein the laser welding process directs the laser energy in a direction that is orthogonal to a plane of the planar welding tab.

13. The method of claim 11, further comprising arranging a housing over the power electronics carrier such that the housing encloses an interior volume of the power semiconductor module, wherein the electrical connector is immediately opposite from a sidewall of the housing, and wherein the meander and the planar welding tab each extend laterally away from the sidewall of the housing in the same direction.

14. The method of claim 13, wherein a separation distance between the upper stanchion and the sidewall of the housing is less than or equal to a lateral extension distance of the meander.

15. The method of claim 11, wherein the power semiconductor module is configured as a half-bridge, and wherein the electrical connector is configured as a power terminal to the half-bridge.

16. The method of claim 11, wherein the width of the opening is at is greater than the width of the planar welding tab, and wherein the opening is aligned with the planar welding tab such that opposite facing outer edge sides of the planar welding tab that are within the outer lateral reach of the meander are exposed from above by the opening.

17. The method of claim 11, wherein the electrical connector comprises a first curved bend that adjoins the welding tab and curves towards the meander, and wherein the first curved bend and the meander collectively form a spring that elastically deforms in a vertical direction that is orthogonal to a plane of the welding tab.

* * * * *